US009583313B2

(12) United States Patent
Okumura

(10) Patent No.: US 9,583,313 B2
(45) Date of Patent: Feb. 28, 2017

(54) PLASMA PROCESSING APPARATUS AND PLASMA PROCESSING METHOD

(71) Applicant: Panasonic Corporation, Osaka (JP)

(72) Inventor: Tomohiro Okumura, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 14/301,450

(22) Filed: Jun. 11, 2014

(65) Prior Publication Data

US 2015/0053645 A1 Feb. 26, 2015

(30) Foreign Application Priority Data

Aug. 20, 2013 (JP) .................................. 2013-170097
Mar. 25, 2014 (JP) .................................. 2014-061808

(51) Int. Cl.
C23C 16/00 (2006.01)
C23F 1/00 (2006.01)
(Continued)

(52) U.S. Cl.
CPC ....... H01J 37/321 (2013.01); H01J 37/32119 (2013.01); H01J 37/32935 (2013.01)

(58) Field of Classification Search
CPC .................................. H05H 1/26; H05H 1/30
(Continued)

(56) References Cited

U.S. PATENT DOCUMENTS 5,591,268 A * 1/1997 Usui et al. ................. 118/723 E
6,180,019 B1 1/2001 Kazumi et al.
(Continued)

FOREIGN PATENT DOCUMENTS

JP 61-68900 4/1986
JP 3-67496 3/1991
(Continued)

OTHER PUBLICATIONS

Tomohiro Okumura et al., "Elongated Inductively Coupled Thermal Plasma Torch Operable at Atmospheric Pressure", Journal of Applied Physics, 52, pp. 05EE01-1 through 05EE01-7, 2013.
(Continued)

Primary Examiner — Rakesh Dhingra
(74) Attorney, Agent, or Firm — Wenderoth, Lind & Ponack, L.L.P.

(57) ABSTRACT

The plasma processing apparatus includes a dielectric member for defining a chamber, a gas introducing part for introducing a gas into the chamber, a discharge coil disposed on one side of the dielectric member and supplied with AC power to generate a plasma in the chamber into which the gas has been introduced, a conductor member disposed on the other side of the dielectric member and facing the discharge coil with the chamber of the dielectric member interposed therebetween, an AC power source for supplying AC voltage to the discharge coil, an opening communicating with the chamber and serving for applying the plasma to a substrate to be processed, and a moving mechanism for moving the substrate relative to the chamber so that the substrate passes across a front of the opening. The discharge coil is grounded or connected to the conductor member via a voltage generating capacitor or a voltage generating coil.

5 Claims, 10 Drawing Sheets

(51) Int. Cl.
*H01L 21/306* (2006.01)
*H01J 37/32* (2006.01)

(58) Field of Classification Search
USPC ............ 156/345.48, 345.49, 345.24–345.28; 118/723 I, 723 IR; 315/111.51
See application file for complete search history.

(56) References Cited

U.S. PATENT DOCUMENTS

| | | | |
|---|---|---|---|
| 6,312,554 B1* | 11/2001 | Ye | ............................. 156/345.38 |
| 6,481,370 B2 | 11/2002 | Kazumi et al. | |
| 6,499,424 B2 | 12/2002 | Kazumi et al. | |
| 6,579,426 B1 | 6/2003 | van Gogh et al. | |
| 6,583,572 B2 | 6/2003 | Veltrop et al. | |
| 6,833,051 B2 | 12/2004 | Kazumi et al. | |
| 6,846,363 B2 | 1/2005 | Kazumi et al. | |
| 2001/0037861 A1 | 11/2001 | Kazumi et al. | |
| 2001/0040009 A1 | 11/2001 | Kazumi et al. | |
| 2002/0079058 A1 | 6/2002 | Okumura et al. | |
| 2002/0084035 A1 | 7/2002 | Kazumi et al. | |
| 2002/0125828 A1 | 9/2002 | Doi et al. | |
| 2004/0255864 A1 | 12/2004 | Jeon et al. | |
| 2006/0220574 A1 | 10/2006 | Ogawa | |
| 2007/0229181 A1 | 10/2007 | Omae et al. | |
| 2008/0003702 A1* | 1/2008 | Cruse et al. | ....................... 438/7 |
| 2008/0023070 A1* | 1/2008 | Sinha | ............................. 136/261 |
| 2010/0300620 A1* | 12/2010 | Kanda | ...................... 156/345.28 |
| 2011/0233170 A1 | 9/2011 | Yamazawa | |
| 2011/0259269 A1* | 10/2011 | Biloiu et al. | ............... 118/723.1 |
| 2012/0038277 A1* | 2/2012 | Eto | ................... H01J 37/32091 315/111.21 |
| 2013/0105460 A1 | 5/2013 | Okumura et al. | |
| 2013/0115780 A1 | 5/2013 | Okumura et al. | |
| 2013/0313227 A1 | 11/2013 | Katagiri | |

FOREIGN PATENT DOCUMENTS

| | | |
|---|---|---|
| JP | 10-270192 | 10/1998 |
| JP | 2000-323298 | 11/2000 |
| JP | 2001-284333 | 10/2001 |
| JP | 2002-343599 | 11/2002 |
| JP | 2004-533090 | 10/2004 |
| JP | 2005-11799 | 1/2005 |
| JP | 2006-32303 | 2/2006 |
| JP | 2006-221852 | 8/2006 |
| JP | 2006-286306 | 10/2006 |
| JP | 2007-273419 | 10/2007 |
| JP | 2009-057639 | 3/2009 |
| JP | 2013-093264 | 5/2013 |
| JP | 2013-120633 | 6/2013 |
| JP | 2013-120684 | 6/2013 |
| JP | 2013-120685 | 6/2013 |
| WO | 2012/111090 | 8/2012 |

OTHER PUBLICATIONS

Partial English translation (Abstract) of Journal of Plasma and Fusion Research, vol. 82, No, 8, pp. 479-483, 2006.

* cited by examiner

PLASMA PROCESSING APPARATUS AND PLASMA PROCESSING METHOD

CROSS-REFERENCE TO RELATED APPLICATIONS

The present application is a priority claim application based on Japanese Patent Applications No. 2013-170097 filed to Japanese Patent Office on Aug. 20, 2013 and No. 2014-61808 filed to Japanese Patent Office on Mar. 25, 2014. The entire disclosures of these Japanese Patent Applications, including specification, claims, drawings, and summary are incorporated herein by reference in their entirety.

TECHNICAL FIELD

The present disclosure relates to a plasma processing apparatus and a plasma processing method for applying plasma irradiation to process a substrate or the like.

BACKGROUND ART

Conventionally, poly-Si (polysilicon) or other semiconductor thin films are widely used for TFTs (Thin Film Transistors) and solar cells. A method for formation of those semiconductor thin films with low cost is one in which an amorphous silicon film is irradiated with laser light so as to be crystallized. Laser process can be applied also to, for example, activation of impurity atoms introduced to the semiconductor substrate by ion injection or plasma doping. However, this laser crystallization technique has such problems as occurrence of laser scanning traces and moreover requires quite expensive equipment.

Thus, there have been discussed techniques for continuously and inexpensively performing heat treatment of a processing-object substrate or the like by applying plasma irradiation via a slit-like opening to make plasma scanning in a direction perpendicular to a longitudinal direction of the opening (see, e.g., JP 2013-120633 A, JP 2013-120684 A, JP 2013-120685 A, and T. Okumura and H. Kawaura, Jpn. J. Appl. Phys. 52(2013)05EE01).

For example, an inductively coupled plasma torch having an opening for plasma irradiation involves some contrivance for facilitating ignition of plasma. It is noted that the term 'ignition' herein refers to generation of a plasma from a no-plasma state. Accordingly, there have conventionally been discussed various ignition methods. In a plasma processing apparatus described in JP 61-68900 A as an example, a cylindrical chamber for plasma generation is set to a vacuum internal state so as to facilitate the plasma ignition. As another example, a plasma processing apparatus described in JP 2002-343599 A employs an ignition-use coil other than a coil for plasma generation. As a further example, a plasma processing apparatus described in JP 3-67496 A is so designed that a high voltage is applied to a metal rod placed within a chamber to ignite a plasma.

With the constitution that a plasma is generated in a space (chamber) between a high-potential conductor member and a low-potential conductor member, as in the plasma processing apparatuses described in JP 2013-120633 A, JP 2013-120684 A and JP 2013-120685 A, it is possible to implement stable plasma ignition under atmospheric pressure without using the plasma ignition methods described in above-mentioned JP 61-68900 A, JP 2002-343599 A and JP 3-67496 A.

SUMMARY OF INVENTION

In the plasma processing apparatuses described in JP 2013-120633 A, JP 2013-120684 A and JP 2013-120685 A, the chamber is defined by a dielectric member (i.e., the chamber is surrounded by a dielectric member). Also, a dielectric member for defining a chamber is placed between a high-potential conductor member and a low-potential conductor member. As a result of this, raising the voltage fed to the conductor members to enhance the plasma processing performance (heating performance) may cause the dielectric member to yield dielectric breakdown.

It could be conceived to lower the voltage applied to the conductor members for suppression of the dielectric breakdown of the dielectric member. However, lowering the voltage may make it less easy to fulfill the plasma ignition.

Therefore, an object of the present disclosure is to provide a plasma processing apparatus and method capable of fulfilling stable plasma ignition and suppressing dielectric breakdown of the dielectric member that defines the chamber.

In order to solve the problem, in one aspect of the present disclosure, there is provided a plasma processing apparatus comprising:

a dielectric member for defining a chamber;

a gas introducing part for introducing a gas into the chamber;

a discharge coil disposed on one side of the dielectric member and supplied with AC power to generate a plasma in the chamber into which the gas has been introduced;

a conductor member disposed on the other side of the dielectric member and facing the discharge coil with the chamber of the dielectric member interposed therebetween;

an AC power source for supplying AC voltage to the discharge coil;

an opening communicating with the chamber and serving for applying the plasma to a substrate to be processed; and a moving mechanism for moving the substrate relative to the chamber so that the substrate passes across a front of the opening, wherein the discharge coil is grounded or connected to the conductor member via a voltage generating capacitor or a voltage generating coil.

According to one aspect of the disclosure, it becomes possible to fulfill a stable plasma ignition and to suppress dielectric breakdown of the dielectric member that defines the chamber.

Preferably, the voltage generating capacitor is variable in capacitance or the voltage generating coil is variable in inductance. In this case, it becomes possible more reliably to satisfy both the fulfillment of a stable plasma ignition and the suppression of dielectric breakdown of the dielectric member that defines the chamber.

Preferably, the conductor member is grounded. In this case, it becomes possible more reliably to fulfill a stable plasma ignition.

Preferably, the conductor member is a second discharge coil. In this case, it becomes possible more reliably to satisfy both the fulfillment of a stable plasma ignition and the suppression of dielectric breakdown of the dielectric member that defines the chamber.

Preferably, the plasma processing apparatus further comprises a trimming capacitor or a trimming coil different from the voltage generating capacitor or the voltage generating coil, wherein the trimming capacitor or the trimming coil, the discharge coil, and the voltage generating capacitor or the voltage generating coil are connected in series in this order. In this case, it becomes possible more reliably to satisfy both the fulfillment of a stable plasma ignition and the suppression of dielectric breakdown of the dielectric member that defines the chamber.

Preferably, the plasma processing apparatus is so constituted that while a series combined capacitance of the voltage generating capacitor and the trimming capacitor or a series combined inductance of the voltage generating coil and the trimming coil is maintained at a constant value, a capacitance of the voltage generating capacitor or an inductance of the voltage generating coil can be adjusted. In this case, it becomes possible more reliably to satisfy both the fulfillment of a stable plasma ignition and the suppression of dielectric breakdown of the dielectric member that defines the chamber.

Preferably, the plasma processing apparatus further comprises a plasma detection device for detecting generation of a plasma, and a high-voltage control unit for controlling the capacitance of the voltage generating capacitor or the inductance of the voltage generating coil on a basis of a detection result of the plasma detection device. In this case, a plasma ignition can be fulfilled more reliably.

Preferably, a frequency of the AC power supplied to the discharge coil is within a range from 10 kHz to 10 MHz. In this case, it becomes possible more reliably to satisfy both the fulfillment of a stable plasma ignition and the suppression of dielectric breakdown of the dielectric member that defines the chamber.

Preferably, the opening is oriented perpendicular to a surface of the substrate to be processed. In this case, a successful plasma processing of the substrate can be fulfilled.

In another aspect of the present disclosure, there is provided a plasma processing method for processing a substrate with a plasma, the method comprising:
  introducing a gas into a chamber defined by a dielectric member;
  supplying an AC power to a discharge coil facing a conductor member with the chamber interposed therebetween so as to generate a plasma in the chamber; and
  moving the substrate relative to the chamber so that the substrate passes across a front of the opening communicating with the chamber, thereby exposing the substrate to the plasma, wherein
  the discharge coil is grounded or connected to the conductor member via a voltage generating capacitor or a voltage generating coil.

According to another aspect of the disclosure, it becomes possible to fulfill a stable plasma ignition and to suppress dielectric breakdown of the dielectric member that defines the chamber.

Preferably, in the plasma processing method, the conductor member is a second discharge coil. In this case, it becomes possible more reliably to satisfy both the fulfillment of a stable plasma ignition and the suppression of dielectric breakdown of the dielectric member that defines the chamber.

Preferably, in the plasma processing method, the voltage generating capacitor is variable in capacitance or the voltage generating coil is variable in inductance,
  the method further comprises:
    setting an impedance of the voltage generating capacitor or the voltage generating coil to a first impedance value;
    supplying an AC power of a first power value to the discharge coil so as to ignite a plasma;
    changing the impedance of the voltage generating capacitor or the voltage generating coil to a second impedance value on completion of the plasma ignition; and
    changing the AC power supplied to the discharge coil to a second power value higher than the first power value. In this case, it becomes possible more reliably to satisfy both the fulfillment of a stable plasma ignition and the suppression of dielectric breakdown of the dielectric member that defines the chamber.

According to the disclosure, it becomes possible to fulfill a stable plasma ignition and to suppress dielectric breakdown of the dielectric member that defines the chamber.

DESCRIPTION OF EMBODIMENTS

Hereinbelow, plasma processing apparatuses according to embodiments of the present disclosure will be described with reference to the accompanying drawings.

Embodiment 1

A plasma processing apparatus according to Embodiment 1 of the disclosure will be described with reference to FIGS. 1 to 4.

Figure 1A:
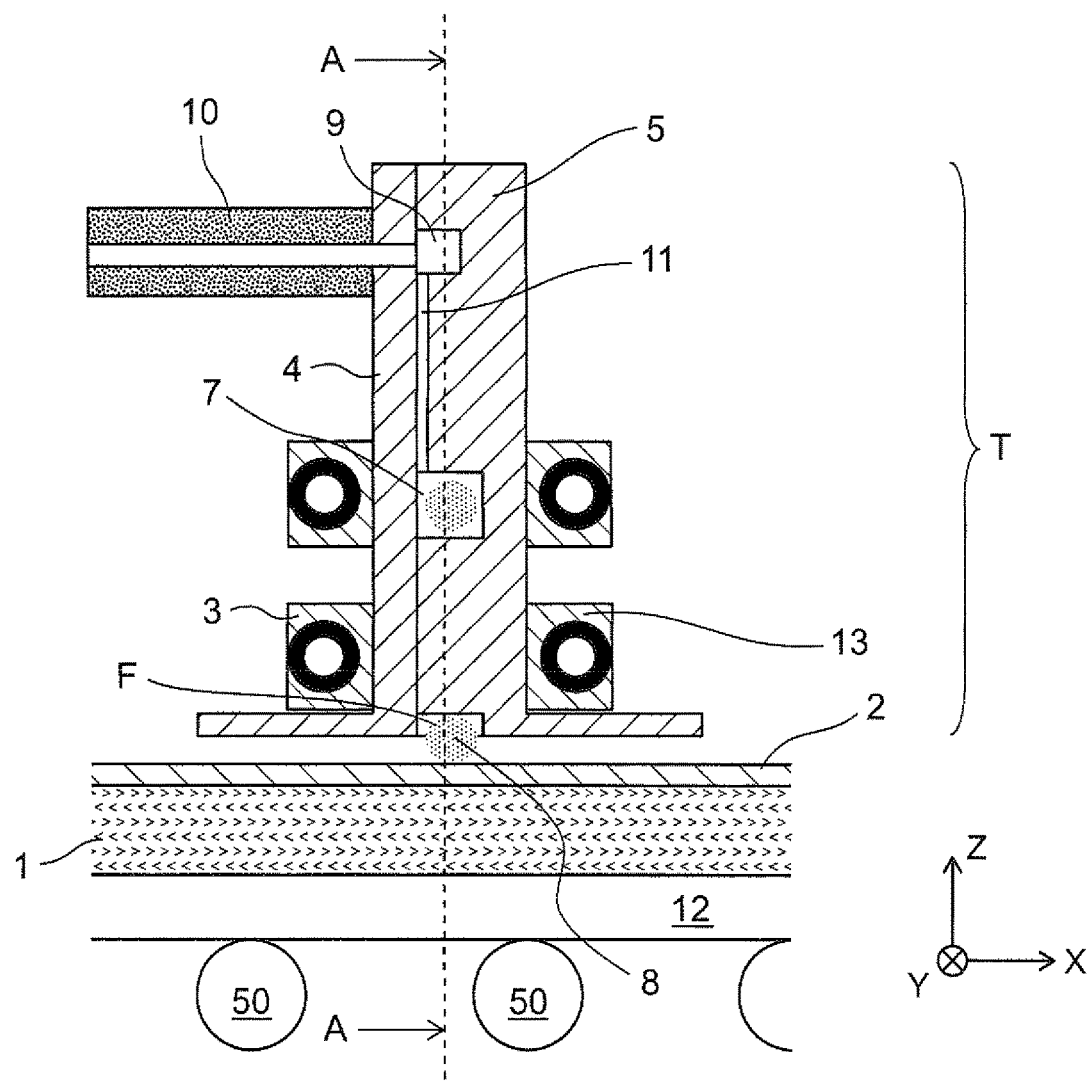
FIG. 1A is a sectional view schematically showing a construction of a plasma processing apparatus according to Embodiment 1 of the present disclosure.
Figure 1B:
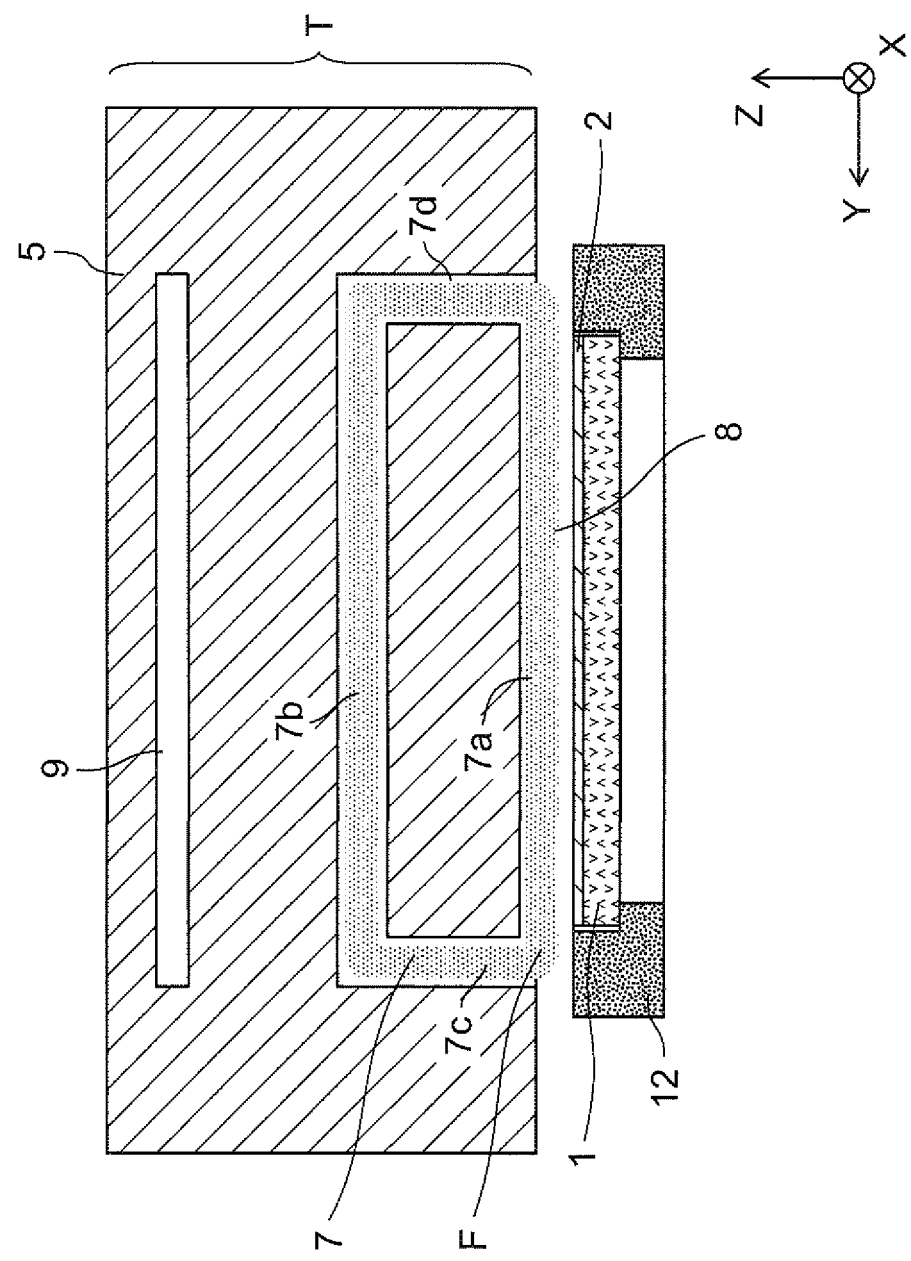
FIG. 1B is a sectional view taken along the line A-A of FIG. 1A.
Figure 2:
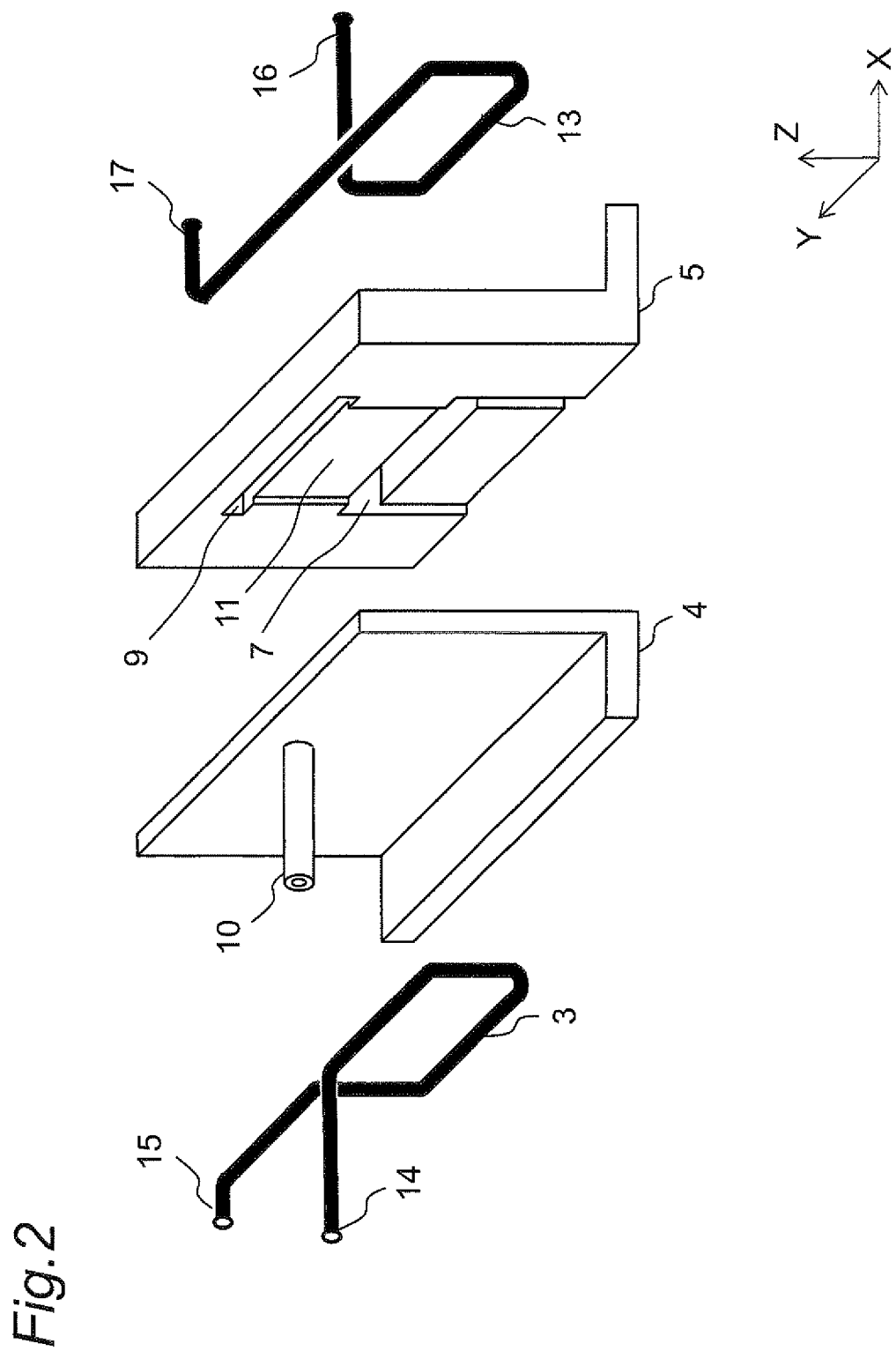
FIG. 2 is a schematic exploded view of the plasma processing apparatus according to Embodiment 1 of the disclosure.

FIG. 1A is a sectional view which schematically shows a construction of a plasma processing apparatus according to Embodiment 1 of the disclosure and, more specifically, as will be described in detail later, which shows a cross section perpendicular to a longitudinal direction (Y-axis direction) of an opening of an inductively coupled plasma torch unit in the plasma processing apparatus. Also, FIG. 1B is a sectional view which is parallel to the longitudinal direction (Y-axis direction) of the opening of the inductively coupled plasma torch unit and which is perpendicular to a substrate that is to be plasma processed. That is, FIG. 1B shows a cross section taken along the line A-A shown in FIG. 1A. FIG. 2 is an exploded view of the inductively coupled plasma torch unit shown in FIGS. 1A and 1B.

FIGS. 1A and 1B also show an inductively coupled plasma torch unit T (hereinafter, referred to as 'plasma torch unit T') under plasma processing for the processing-object substrate 1.

As shown in FIGS. 1A and 1B, a thin film 2 is formed on one surface of the substrate 1 facing the plasma torch unit T.

The plasma torch unit T has a first discharge coil 3 for generating a plasma F, a first ceramics block 4 formed from dielectric, and a second ceramics block 5 formed from dielectric.

The first discharge coil 3 is made up from a copper pipe having a circular cross section, and a copper block having a rectangular (or square) cross section and covering the copper pipe. The first discharge coil 3 is placed near the first ceramics block 4.

The first ceramics block 4 and the second ceramics block 5 are in contact with each other so that a chamber 7 and a slot-like opening 8 communicating with the chamber 7 are defined therebetween.

More specifically, the chamber 7 and the opening 8 are provided along a plane (Y-Z plane) perpendicular to a thin film 2-side surface (plasma-exposure side surface) of the substrate 1. The opening 8 is a slot-like opening which is longer in a direction (Y-axis direction) parallel to the plane (Y-Z plane) extending along the chamber 7 and the opening 8 and to the thin film 2-side surface of the substrate 1.

Also, the opening 8 is placed relative to the substrate 1 so that a plane containing an opening rim of the opening becomes parallel to the thin film 2-side surface of the substrate 1. During plasma processing, the opening is set near the thin film 2-side surface of the substrate 1. As a result, the opening 8 is substantially blocked by the substrate 1 so that inside of the chamber 7 is formed into a substantially closed space. That is, peripheral portions of the opening 8 and the thin film 2-side surface of the substrate 1 are as near as possible to each other without contact.

The first discharge coil 3 is so made up that its center axis extends parallel to the thin film 2-side surface of the substrate 1 and becomes perpendicular to the plane (Y-Z plane) extending along the chamber 7 and the opening 8 (in other words, the center axis of the first discharge coil 3 extends in an X-axis direction). That is, the first discharge coil 3 is provided so that a plane containing a one-turn element wire of the first discharge coil 3 becomes perpendicular to the thin film 2-side surface of the substrate 1 and moreover parallel to the plane (Y-Z plane) extending along the chamber 7 and the opening 8.

The plasma torch unit T is wholly surrounded by a grounded shielding member (not shown) formed from a conductor. As a result, high-frequency leaks (noise) can be effectively prevented and moreover unfavorable abnormal discharge or the like can be effectively prevented.

The chamber 7 is defined, in this case of Embodiment 1, by one plane of the first ceramics block 4, and a groove provided in the second ceramics block 5. Also, the first ceramics block 4 and the second ceramics block 5 are dielectrics affixed to each other. Therefore, the chamber 7 is surrounded by dielectrics except the opening 8.

Also, the chamber 7 is formed into an annular shape. The term 'annular shape' herein refers to endless shapes and not limited to circular shapes. For example, the chamber 7 includes a linear portion 7a communicating with the opening 8 and extending in a longitudinal direction (Y-axis direction) of the opening 8, a linear portion 7b extending with a distance to and in parallel to the linear portion 7a, and linear portions 7c, 7d for connecting both ends of the two linear portions 7a, 7b, respectively. In addition, the linear portions 7a, 7b of the chamber 7 are depicted as being longer than the linear portions 7c, 7d in FIG. 1B, but this is not limitative. The linear portions 7a, 7b may be shorter than or equal in length to the linear portions 7c, 7d.

As shown in FIGS. 1A, 1B and FIG. 2, a plasma gas manifold 9 is provided inside the second ceramics block 5. A gas is supplied to the plasma gas manifold 9 via a plasma gas supply pipe 10. The supplied gas is introduced to the chamber 7 via a plasma gas supply hole 11 serving as a gas introducing part provided in the second ceramics block 5. This arrangement as shown above makes it easily achievable to make a uniform gas flow in the annular-shaped chamber 7. The flow rate of gas flowing through the plasma gas supply pipe 10 is controlled by a flow rate control device (not shown) such as a mass flow controller provided upstream of the pipe.

In this Embodiment 1, the plasma gas supply hole 11, counting one in quantity as shown in FIG. 2, is made up of a wide groove which is formed on a surface of the second ceramics block 5 to be put into contact with the first ceramics block 4 and which extends from the plasma gas manifold 9 toward chamber 7, and a plane of the first ceramics block 4 facing the groove. Instead of this, a plasma supply hole extending from the plasma gas manifold 9 toward the chamber 7 and having a circular-shaped cross section may be arrayed in plurality along an extending direction (Y-axis direction) of the opening 8.

According to the plasma torch unit T having such a construction as shown above, when AC power is applied to the first discharge coil 3, an AC electromagnetic field is generated in the chamber 7, to which a plasma gas has been supplied via the plasma gas supply pipe 10, the plasma gas manifold 9 and the plasma gas supply hole 11. As a result, a plasma F is generated in the chamber 7, i.e., in a space surrounded by the first ceramics block 4, the second ceramics block 5 and the substrate 1. To this generated plasma F, the substrate 1 is exposed via the opening 8.

The substrate 1, as shown in FIG. 1B, is placed on a tray-like substrate holder 12. More specifically, the substrate holder 12 has a through hole having a cross section generally similar to and slightly smaller than external shape of the substrate 1, and a counterbore portion generally similar to and slightly larger than the external shape of the substrate 1. The through hole is communicated with the counterbore portion. The substrate is placed at the counterbore portion of the substrate holder 12 made up as shown above.

Depth of the counterbore portion of the substrate holder 12 is set generally equal to thickness of the substrate 1. As a result, a plasma torch unit T-side surface (surface portion except the counterbore portion) of the substrate holder 12 and the thin film 2-side surface of the substrate 1 are positioned generally flush with each other.

Consequently, when the substrate holder 12 is moved relative to the plasma torch unit T so as to pass across the front of the opening 8 of the plasma torch unit T, more specifically, with the opening 8 and the surface of the substrate holder 12 kept parallel to each other, a plasma state occurring in the chamber 7 while the opening 8 and the substrate holder 12 face each other, and a plasma state occurring in the chamber 7 while the opening 8 and the substrate 1 face each other, become generally constant. That is, fluctuations of plasma due to a difference of the distance between the opening 8 and the substrate holder 12 from the distance between the opening 8 and the substrate 1 can be suppressed.

A second discharge coil 13 as a conductor member is placed near the second ceramics block 5. More specifically, the second discharge coil 13 is placed so as to face the first discharge coil 3 with the first ceramics block 4 and the second ceramics block 5 interposed therebetween (i.e., with the chamber 7 interposed therebetween).

The second discharge coil 13, as in the first discharge coil 3, is made up from a copper pipe having a circular cross section, and a copper block having a rectangular (or square) cross section and covering the copper pipe.

The second discharge coil 13 is so made up that its center axis extends parallel to the thin film 2-side surface of the substrate 1 and becomes perpendicular to the plane (Y-Z plane) extending along the chamber 7 and the opening 8 (in other words, the center axis of the second discharge coil 13 extends in the X-axis direction). That is, the second discharge coil 13 is provided so that a plane containing a one-turn element wire of the second discharge coil 13 becomes perpendicular to the thin film 2-side surface of the substrate 1 and moreover parallel to the plane (Y-Z plane) extending along the chamber 7 and the opening 8. Preferably, the center axis of the first discharge coil 3 and the center axis of the second discharge coil 13 are positioned on one straight line.

A refrigerant flows inside the copper pipes in the first discharge coil 3 and the second discharge coil 13. Also, copper blocks of the first discharge coil 3 and the second discharge coil 13 covering the copper pipes are bonded to the first ceramics block 4 and the second ceramics block 5 with an adhesive (not shown). As shown above, the first discharge coil 3 and the second discharge coil 13, by virtue of their having a rectangular (or square) cross section, is enabled to make planar contact with the first ceramics block 4 and the second ceramics block 5 so that the adhesive for bonding these members can be made as thin as possible. Besides, successful thermal conduction can be ensured both between the first discharge coil 3 and the first ceramics block 4 and between the second discharge coil 13 and the second ceramics block 5. As a result, providing a flow of water or other refrigerant through the copper pipes of the first discharge coil 3 and the second discharge coil 13 makes it possible to achieve a successful cooling of the first discharge coil 3, the second discharge coil 13, the first ceramics block 4 and the second ceramics block 5.

The slot-like opening 8 of the plasma torch unit T is formed into, for example, a narrow, elongated rectangular shape. The substrate 1 is placed so that its thin film 2-side surface faces the opening 8 as shown above. Before the substrate 1 is placed so as to face the opening 8, a plasma F is generated in the chamber 7. That is, while the gas is kept jetted out from the opening 8 by the gas being supplied into the chamber 7, an AC power (high-frequency power) of e.g. 4 MHz is supplied to the first discharge coil 3 by an AC power source (not shown), by which the plasma F is generated in the chamber 7. In this state, the substrate holder 12 is moved so as to cause the substrate 1 to pass across the front of the opening 8 of the plasma torch unit T, thus making the thin film 2-side surface of the substrate 1 exposed to the plasma F near the opening 8.

More specifically, with the opening 8 and the thin film 2-side surface of the substrate 1 kept in parallel to each other, the substrate 1 is moved relative to the chamber 7 in the direction (X-axis direction) perpendicular to the longitudinal direction (Y-axis direction) of the opening 8. That is, at least one of the plasma torch unit T and the substrate 1 is moved.

Although various kinds of gases are usable as the gas to be supplied into the chamber 7, yet the gas for use is desirably composed mainly of an inert gas in terms of plasma stability, ignitability, service lives of component parts exposed to the plasma, and the like. Typically, Ar gas is used among others. In a case where the plasma is generated from Ar alone, a considerably high-temperature plasma (10,000K or higher) results.

Proper conditions for plasma generation include such quantities as a scanning speed of 50-3000 mm/s, a plasma gas total flow rate of 1-100 SLM, a $H_2$ concentration of 0-10% in Ar+$H_2$ gas, and a high-frequency electric power of about 0.5-50 kW. However, among these various quantities, gas flow rate and electric power are given as values for a longitudinal-direction (Y-axis direction) length of 100 mm of the opening 8 of the plasma torch unit T. Accordingly, when the longitudinal-direction length of the opening 8 is shorter or longer as compared with 100 mm, parameters of the gas flow rate, the electric power and the like need to be adjusted in proportion thereto.

The longitudinal-direction (Y-axis direction) size of the opening 8 of the plasma torch unit T is generally equal to a size of the substrate 1 (its size in a direction perpendicular to the relative movement direction (X-axis direction) of the substrate 1). Therefore, as the substrate 1 is moved relative to the chamber 7 in the direction (X-axis direction) perpendicular to the longitudinal direction (Y-axis direction) of the opening 8 with the opening 8 and the thin film 2-side surface of the substrate 1 kept in parallel to each other, the substrate 1 as a whole is processed by the plasma F.

In this Embodiment 1, movement of the substrate holder 12 that holds the substrate 1 causes the substrate 1 to be moved relative to the chamber 7. For example, as shown in FIG. 1A, the substrate holder 12 is conveyed by a plurality of rollers 50 serving as a moving mechanism for movement of the substrate holder 12. The plurality of rollers 50, being rotatable about rotational center lines extending in directions perpendicular to the moving direction (X-axis direction) of the substrate holder 12, are arrayed in the moving direction (X-axis direction) of the substrate holder 12. The substrate holder 12 is conveyed by being in contact with outer circumferential surfaces of the rotating rollers 50 as shown above.

In addition, the substrate 1 may be conveyed directly by the plurality of rollers 50 without the aid of the substrate holder 12. Also, the moving mechanism for movement of the substrate 1 (or the substrate holder 12 that holds the substrate 1) relative to the chamber 7 may be provided as a robot, a linear slider or the like without being limited to the rollers 50.

Furthermore, since the thin film 2-side surface of the substrate 1 is exposed to portions of the plasma F where plasma F temperature, electron density and active particle density are higher, i.e., portions of the plasma F close to the opening 8 of the plasma torch unit T, the substrate 1 can be processed at high speed or with high temperatures.

Figure 3:
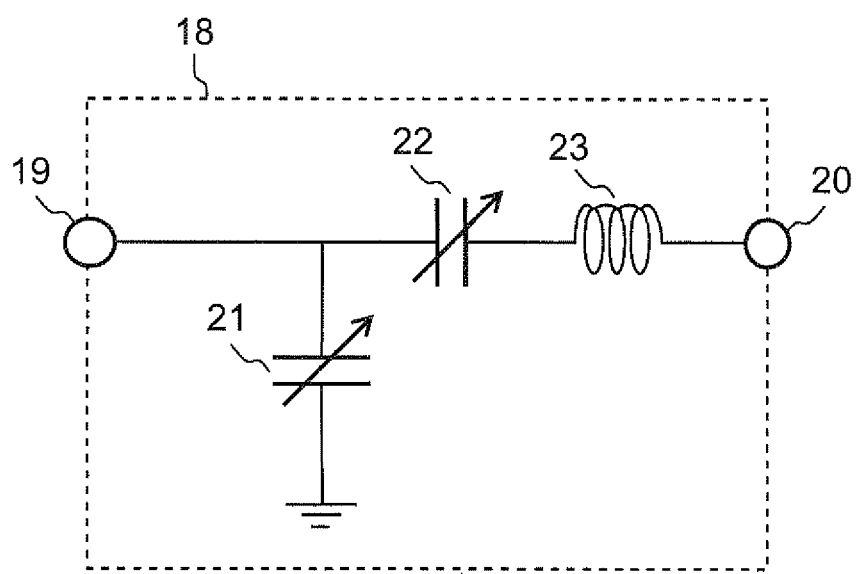
FIG. 3 is a circuit diagram showing a construction of a matching circuit of the plasma processing apparatus according to Embodiment 1 of the disclosure.

FIG. 3 is a circuit diagram showing a construction of a matching circuit 18 which is to be provided between the first discharge coil 3 and AC power source (high-frequency power source) (not shown) and which serves for impedance matching according to this Embodiment 1.

As shown in FIG. 3, an input terminal 19 of the matching circuit 18 and the high-frequency power source are connected to each other via a coaxial cable (not shown) as an example. An output terminal 20 of the matching circuit 18 is connected to the first discharge coil 3 as will be described later.

Also, the input terminal 19 of the matching circuit 18 is grounded via a first variable capacitor 21. The input terminal 19 is further connected to the output terminal 20 via a second variable capacitor 22 and a matching-use fixed coil 23 which are connected in series.

Figure 4:
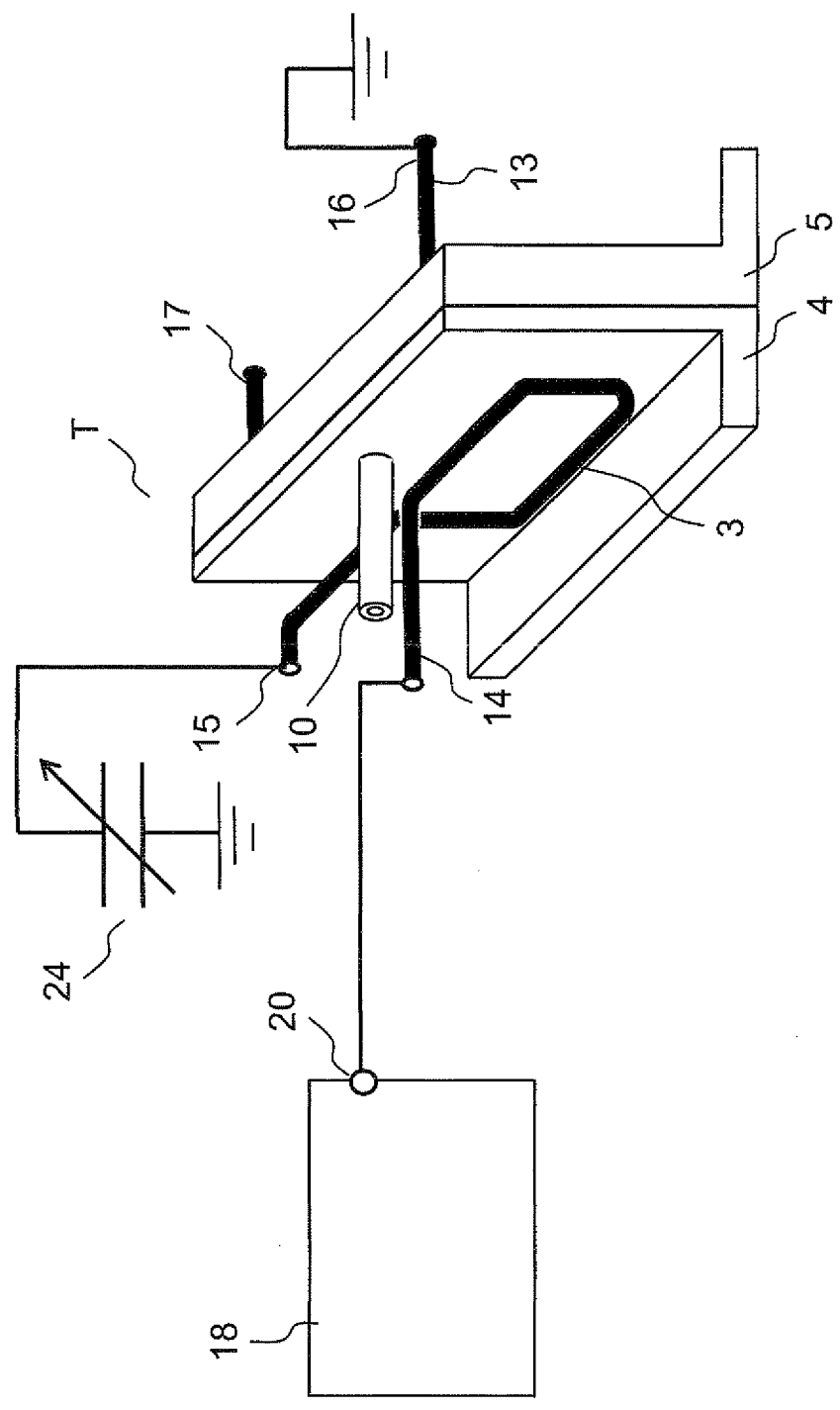
FIG. 4 is a schematic perspective view showing electrical connections of the plasma processing apparatus according to Embodiment 1 of the disclosure.

FIG. 4 is a perspective view showing electrical connections for the plasma torch unit T shown in FIGS. 1A, 1B and FIG. 2.

As shown in FIG. 4, one end 14 of the first discharge coil 3 is connected to the output terminal 20 of the matching circuit 18. The other end 15 of the first discharge coil 3 is grounded via a high-voltage generating capacitor 24. The high-voltage generating capacitor 24 is a variable capacitor.

One end 16 of the second discharge coil 13 is grounded, while the other end 17 of the second discharge coil 13 is electrically floating. Instead, the other end of the second discharge coil 13 may be grounded. Otherwise, the second discharge coil 13 may be non-grounded. A conductor member facing the first discharge coil 3 may be not the second discharge coil 13 but a conductor member of some other shape such as a ring-shaped conductor member, a rectangular plate-shaped conductor member, or the like.

In the plasma torch unit T constructed as shown above, the first discharge coil 3 of relatively high potential and the second discharge coil 13 of lower potential as compared with the first discharge coil 3 face each other with a narrow space (chamber 7) interposed therebetween. On condition that high-frequency power is supplied to the first discharge coil 3 until the first discharge coil 3 comes to a high potential as compared with the second discharge coil 13, there occurs high electric fields over the whole ring-shaped chamber 7, causing the plasma F to be ignited.

The plasma processing apparatus having such an inductively coupled plasma torch as in this Embodiment 1 is, in many cases, operated over a mode jump to the inductive coupling mode after a plasma ignition in a capacitive coupling mode. The term 'mode jump' herein refers to a phenomenon that a plasma yields discontinuous state changes between the capacitive coupling mode of low temperature and low electron density and the inductive coupling mode of high temperature and high electron density. Since electric discharge in the capacitive coupling mode under atmospheric pressure is more likely to occur in a narrow space, a plasma of the capacitive coupling mode can be obtained relatively easily with the arrangement in this case.

Here is considered a high-frequency voltage generated at the first discharge coil 3.

First, an inductance of the first discharge coil 3, which depends on its shape, is $L_1=1.7$ μH as an example. Given that the frequency of the high-frequency power supplied to the first discharge coil 3 is f=4 MHz, the impedance of the first discharge coil 3 becomes $Z=2\pi fL_1=43\Omega$. Also, a real part of the impedance as the load side (first discharge coil 3 side) is viewed from the output terminal 20 of the matching circuit 18, which depends on the shape of the first discharge coil 3 and the structure of the plasma torch unit T, is $R=10\Omega$ as an example. Therefore, with a high-frequency power of, for example, P=30 kW supplied to the first discharge coil 3, the current flowing through the first discharge coil 3 is $I=(P/R)^{1/2}=55$ A. A resulting interterminal voltage (a voltage difference between one end 14 and the other end 15) of the first discharge coil 3 is $V=ZI=2.4$ kV.

Given that the frequency of the high-frequency power supplied to the first discharge coil 3 is not 4 MHz but 13.56 MHz, the resulting interterminal voltage of the first discharge coil 3 is V=7.9 kV.

Thus, with use of the high-frequency power of 4 MHz, the interterminal voltage of the first discharge coil 3 becomes smaller than in the case where the high-frequency power of 13.56 MHz is used.

In the case where the plasma F is generated in the chamber 7 interposed between the first discharge coil 3 of high potential and the second discharge coil 13 of low potential as in this Embodiment 1, the higher the interterminal voltage of the first discharge coil 3 is, the more stably the ignition of plasma F can be fulfilled under atmospheric pressure. In other words, the higher the frequency of the high-frequency power supplied to the first discharge coil 3 is, the more stably the ignition of plasma F can be fulfilled.

However, the first ceramics block 4 and the second ceramics block 5 each formed from dielectric and defining the chamber 7 are present between the first discharge coil 3 of high potential and the second discharge coil 13 of low potential. Since the withstand voltage of such ceramic materials as alumina and silicon nitride is on the order of 10 kV/mm, the first ceramics block 4 and the second ceramics block 5, when being small in thickness for fulfillment of higher cooling efficiency as an example, may yield dielectric breakdown.

Thus, heightening the frequency of the high-frequency power supplied to the first discharge coil 3 indeed enhances the ignitability of the plasma F but may result in dielectric breakdown of the first ceramics block 4 and the second ceramics block 5 formed from dielectric and defining the chamber 7.

Therefore, the inventor considered the following things in order to satisfy both the plasma ignitability and the suppression of dielectric breakdown of the dielectric member. That is, under the condition that the frequency of the high-frequency power supplied to the first discharge coil 3 is kept at such relatively low frequencies at which there occurs no dielectric breakdown of the dielectric member, the voltage of the first discharge coil 3 is set relatively higher at the time of ignition of the plasma F to enhance the electric field generated in the chamber 7, and the voltage of the first discharge coil 3 is set relatively lower during the operation in the inductive coupling mode after the ignition.

More specifically, first, in an ignition sequence for ignition of the plasma F, the capacitance of the high-voltage generating capacitor 24 is adjusted to a small one, e.g., 125 pF. In this case, given an inductance $L_1=1.7$ μH of the first discharge coil 3 and a frequency f=4 MHz of the high-frequency power supplied to the first discharge coil 3 as described above, a combined impedance of the first discharge coil 3 and the high-voltage generating capacitor 24 is $Z=1/(2\pi fC)-2\pi fL_1=280\Omega$. In this connection, given a high-frequency power of P=5 kW as an example, a voltage generated at the one end 14 of the first discharge coil 3 becomes $V=ZI=Z \cdot (P/R)^{1/2}=6.2$ kV, showing that even an electric power as small as 5 kW makes it possible to obtain enough high voltage for ignition.

Once a plasma F is ignited, the plasma F is not lost even if the voltage of the first discharge coil 3 has lowered to some extent. Therefore, after the ignition of the plasma F, the capacitance of the high-voltage generating capacitor 24 is adjusted to, e.g., 500 pF so as to be larger than 125 pF. In this case, a combined impedance of the first discharge coil 3 and the high-voltage generating capacitor 24 is $Z=1/(2\pi fC)-2\pi fL_1=37\Omega$, with the result that the voltage generated at the one end 14 of the first discharge coil 3 becomes quite small, being $V=ZI=Z\cdot(P/R)^{1/2}=0.83$ kV.

Thereafter, the high-frequency power is increased to, e.g., P=30 kW that is enough to cause a mode jump from the capacitive coupling mode to the inductive coupling mode. The voltage generated at the one end 14 of the first discharge coil 3 is $V=ZI=Z\cdot(P/R)^{1/2}=2.0$ kV, which allows the plasma processing to be executed at a low voltage enough to eliminate the fear of occurrence of dielectric breakdown of the first ceramics block 4 and the second ceramics block 5 formed from dielectric.

Based on the above-described inventors conceptions, the plasma processing apparatus is so constituted that a high-frequency power of relatively low frequency (e.g., 4 MHz) is supplied to the first discharge coil 3 and moreover the following operation sequence is executed.

The operation sequence of the plasma processing apparatus includes:

(1) a first step for, with a purpose of adjusting the impedance value of the high-voltage generating capacitor 24 to a first impedance value (e.g., 320Ω), adjusting the capacitance value of the high-voltage generating capacitor 24 to a first capacitance value (125 pF corresponding to 320Ω), and moreover setting the power value of the high-frequency power to a first power value (e.g., 5 kW);

(2) a second step for supplying the high-frequency power to the first discharge coil 3 to ignite the plasma F;

(3) a third step for, with a purpose of setting the impedance value of the high-voltage generating capacitor 24 to a second impedance value (e.g., 80Ω) smaller than the first impedance value, adjusting the capacitance value of the high-voltage generating capacitor 24 to a second capacitance value (500 pF corresponding to 80Ω) after the ignition of the plasma F; and (4) a fourth step for setting the power value of the high-frequency power to a second power value (e.g., 30 kW) larger than the first power value.

In order to execute the above operation sequence, the plasma processing apparatus includes an AC power source (not shown) enabled to change the power value of the AC power (high-frequency power) supplied to the first discharge coil 3, and a capacitance control unit (not shown) for changing the capacitance of the high-voltage generating capacitor 24.

Execution of the above-shown operation sequence by the plasma processing apparatus makes it possible to satisfy both the ignitability of the plasma F and the suppression of dielectric breakdown of the dielectric members (the first ceramics block 4 and the second ceramics block 5).

In addition, other merits also lie in that the high-frequency power of relatively low frequency is supplied to the first discharge coil 3.

For example, in the case of processing of a large-size substrate 1, the longitudinal-direction (Y-axis direction) size of the opening 8 of the plasma torch unit T needs to be enlarged correspondingly. That is, the chamber 7 needs to be a large space. In order that the plasma F is generated in the whole large chamber 7, the size of the first discharge coil 3, i.e. its element-wire length, has to be made large.

An increase in the element wire length causes the inductance of the first discharge coil 3 to be increased, causing the interterminal voltage of the first discharge coil 3 to be increased. As a result, the risk of dielectric breakdown of the first ceramics block 4 and the second ceramics block 5 formed from dielectric is increased.

However, since impedance and interterminal voltage of the first discharge coil 3 are proportional to the frequency of the high-frequency power supplied to the first discharge coil 3, the interterminal voltage of the first discharge coil 3 can be lowered by using a high-frequency power of relatively low frequency.

Also, in matching process, since the series circuit from the input terminal 19 of the matching circuit 18 to the load comes to a generally series resonant state, interterminal voltages of the second variable capacitor 22 and the high-voltage generating capacitor 24 can be reduced to smaller ones by properly selecting the inductance of the matching-use fixed coil 23 of the matching circuit 18 (by keeping the combined inductance of the matching-use fixed coil 23 and the first discharge coil 3 from becoming an excessively high one).

As yet another merit, for example, eddy currents occurring to the electroconductive substrate 1 or the thin film 2 due to high-frequency electromagnetic fields radiated from the first discharge coil 3 can be suppressed. As a result of this, in the case where, for example, fine devices such as thin film transistors (TFTs) or the like are formed on the substrate 1, breakdown due to eddy currents of the fine devices is suppressed.

In the above-described case, both the second variable capacitor 22 of the matching circuit 18 and the high-voltage generating capacitor 24 are provided as capacitance-adjustable variable capacitors, while the matching-use fixed coil 23 is provided as an inductance-constant fixed coil. However, this is not limitative.

Instead of the second variable capacitor 22, for example, a capacitance-fixed fixed capacitor may be used. Otherwise, an inductance-adjustable variable inductor may be used instead of the matching-use fixed coil 23. Otherwise, without use of the second variable capacitor 22, a matching state may be obtained by using a variable inductor provided instead of the matching-use fixed coil 23 as well as using the high-voltage generating capacitor 24.

Also, in a case where the high-frequency power supplied to the first discharge coil 3 is relatively small, the high-voltage generating capacitor 24 may be a fixed capacitor. That is, the capacitance value of the high-voltage generating capacitor 24, which is a fixed capacitor, and the power value of the high-frequency power supplied to the first discharge coil 3 are properly set to such values that the plasma F can be ignited and moreover dielectric breakdown of the first ceramics block 4 and the second ceramics block 5 formed from dielectric can be suppressed.

Further, instead of directly grounding the one end 16 of the second discharge coil 13, it is also allowable to ground the second discharge coil 13 via a coil or capacitor of very small impedance. Also, the high-frequency power, although supplied to the first discharge coil 3 affixed to the first ceramics block 4 having no groove formed therein as shown in FIG. 2, yet may be supplied to the second discharge coil 13 affixed to the second ceramics block 5 having a groove formed therein instead of the above case.

Furthermore, the plasma processing apparatus may include, as plasma generation detecting devices for detecting generation of a plasma, for example, a photodiode for detecting plasma emission, a thermometer for detecting temperature of the torch, a thermometer for detecting temperature of a dummy substrate, a thermometer for detecting temperature of the tray that holds the substrate, and the like. The plasma processing apparatus may include a high-voltage control unit (not shown) for changing the capacitance of the high-voltage generating capacitor 24 based on detection results of the above-mentioned plasma generation detecting devices. For example, the high-voltage control unit is so designed that the capacitance value of the high-voltage generating capacitor 24 is adjusted from the first capacitance value to the second capacitance value after the ignition of the plasma F (after detection of generation of the plasma F) in order to execute the above-described operation sequence.

Further, the frequency of the high-frequency power supplied to the first discharge coil 3 is desirably more than 10 kHz and less than 10 MHz. With the frequency lower than 10 kHz, the high-voltage generating capacitor 24 needs to have a capacitance of tens of thousands pF, whereas such high-capacitance, high-withstand-voltage capacitors are quite hardly available. On the other hand, with the frequency higher than 10 MHz, the interterminal voltage of the coil to which such high-frequency power is supplied becomes higher, so that the state in which a high voltage is normally applied to the coil is maintained. As a result, the merit by supplying the high-frequency power of relatively low frequency as described above is impaired.

Embodiment 2

Embodiment 2 of the disclosure will be described below with reference to FIG. 5. It is noted that the plasma torch unit T and the matching circuit 18 are identical in construction to those of the above-described Embodiment 1.

Figure 5:
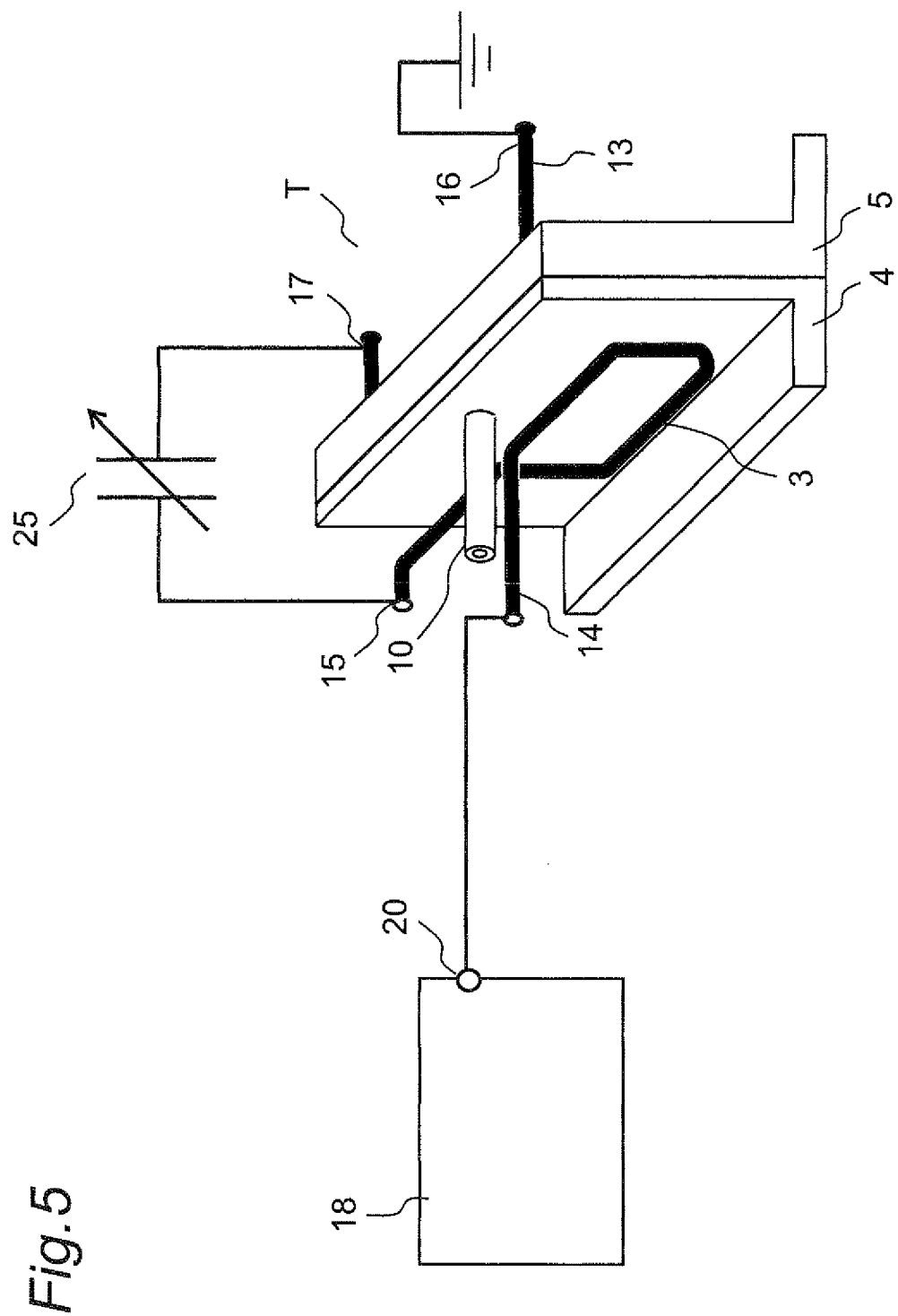
FIG. 5 is a schematic perspective view showing electrical connections of a plasma processing apparatus according to Embodiment 2 of the disclosure.

FIG. 5 is a perspective view showing electrical connections for the plasma torch unit T according to this Embodiment 2.

As shown in FIG. 5, one end 14 of the first discharge coil 3 is connected to an output terminal 20 of the matching circuit 18. The other end 15 of the first discharge coil 3 is connected to the other end 17 of the second discharge coil 13 via a high-voltage generating capacitor 25. The high-voltage generating capacitor 25 is a variable capacitor. One end 16 of the second discharge coil 13 is grounded.

In addition, the one end 16 of the second discharge coil 13 may be non-grounded. A conductor member facing the first discharge coil 3 may be not the second discharge coil 13 but a conductor member of some other shape such as a ring-shaped conductor member, a rectangular plate-shaped conductor member, or the like.

Also, in this Embodiment 2, since the impedance of the second discharge coil 13 is small enough, the voltage of the second discharge coil 13 becomes relative lower. When the capacitance of the high-voltage generating capacitor 25, which connects the first discharge coil 3 and the second discharge coil 13 to each other, is set small enough, the voltage of the first discharge coil 3 becomes relatively higher, causing a large potential difference to occur between the first discharge coil 3 and the second discharge coil 13. As a result, even if the high-frequency power supplied to the first discharge coil 3 is low, the plasma F can be easily ignited.

Once a plasma F is ignited, the plasma F is not lost even if the voltage of the first discharge coil 3 has lowered to some extent. Therefore, after the ignition of the plasma F, the high-voltage generating capacitor 25 is adjusted so that its capacitance is increased. Thereafter, the high-frequency power is increased so as to become large enough to cause a mode jump from the capacitive coupling mode to the inductive coupling mode.

As shown above, the plasma processing apparatus executes an operation sequence including: a first step for, while keeping the frequency of the high-frequency power supplied to the first discharge coil 3 at a relatively low frequency, adjusting the impedance value of the high-voltage generating capacitor 25 to a first impedance value and moreover setting the power value of the high-frequency power to a first power value; a second step for supplying the high-frequency power to the first discharge coil 3 to ignite the plasma F; a third step for, after the ignition of the plasma F, setting the impedance value of the high-voltage generating capacitor 25 to a second impedance value smaller than the first impedance value; and a fourth step for setting the power value of the high-frequency power to a second power value larger than the first power value.

As a result of this, it becomes possible to satisfy both the ignitability of the plasma F and the suppression of dielectric breakdown of the dielectric members (i.e., the first ceramics block 4 and the second ceramics block 5).

In this Embodiment 2, the first discharge coil 3 and the second discharge coil 13 are placed so as to face each other with the first ceramics block 4 and the second ceramics block 5 interposed therebetween, and moreover the first discharge coil 3 and the second discharge coil 13 are connected in series at positions apart from the chamber 7 via the high-voltage generating capacitor 25. Therefore, the first discharge coil 3 and the second discharge coil 13 are so made up that directions of high-frequency electromagnetic fields generated in the chamber 7 by the first discharge coil 3 and the second discharge coil 13 respectively become equal to each other with the high-frequency power supplied thereto. Thus, as compared with Embodiment 1, given that the same high-frequency power is supplied, the electromagnetic fields generated in the chamber 7 become higher in intensity so that the plasma F is more easily ignitable.

In addition, in the operation sequence of this Embodiment 2 as described above, the second impedance value of the high-voltage generating capacitor 25 is smaller than the first impedance value. However, there may be cases where their magnitude correlation is reversed.

That is, in some cases, the plasma processing apparatus may execute an operation sequence including; a first step for, while keeping the frequency of the high-frequency power supplied to the first discharge coil 3 at a relatively low frequency, adjusting the impedance value of the high-voltage generating capacitor 25 to a first impedance value and moreover setting the power value of the high-frequency power to a first power value; a second step for supplying the high-frequency power to the first discharge coil 3 to ignite the plasma F; a third step for, after the ignition of the plasma F, setting the impedance value of the high-voltage generating capacitor 25 to a second impedance value larger than the first impedance value; and a fourth step for setting the power value of the high-frequency power to a second power value larger than the first power value. Such a case as shown above will be described below in detail.

As a typical example, inductances of the first discharge coil 3 and the second discharge coil 13 are relatively large. In such a case, in order to cancel the combined inductance of the first discharge coil 3 and the second discharge coil 13 and further obtain an even larger capacitive impedance, there is a need for extremely reducing the capacitance of the high-voltage generating capacitor 25. However, in view of enlarging the capacitance of the high-voltage generating capacitor 25 after the ignition of the plasma F as described above, there is a limit for extremely reducing the capacitance. The reason of this is that large-capacitance variable capacitors cannot be set to extremely small capacitances.

For example, here is considered a case where inductances of the first discharge coil 3 and the second discharge coil 13 are both $L_1=L_2=2.5$ μH. Given that the frequency of the high-frequency power supplied to the first discharge coil 3 is f=4 MHz, the combined impedance of the first discharge coil 3 and the second discharge coil 13 results in $Z=2\pi fL_1+2\pi fL_2=126\Omega$. Also, the real part of the impedance as the load side (first discharge coil 3 side) is viewed from the output terminal 20 of the matching circuit 18 is assumed as $R=10\Omega$.

In the ignition sequence, the capacitance of the high-voltage generating capacitor 25 is adjusted to a large one, 2500 pF as an example. In this case, a combined impedance of the first discharge coil 3, the high-voltage generating capacitor 25 and the second discharge coil 13 is $Z=2\pi fL_1+2\pi fL_2-1/(2\pi fC)=110\Omega$. Therefore, given that the high-frequency power is P=5 kW, the voltage generated at the one end 14 of the first discharge coil 3 is $V=ZI=Z\cdot(P/R)^{1/2}=2.5$ kV, showing that even an electric power as small as 5 kW makes it possible to obtain enough high voltage for ignition.

Once a plasma F is ignited, the plasma F is not lost even if the voltage of the first discharge coil 3 has lowered to some extent. Therefore, after the ignition of the plasma F, the capacitance of the high-voltage generating capacitor 25 is adjusted to, e.g., 500 pF so as to be smaller than 2500 pF. In this case, a combined impedance of the first discharge coil 3, the high-voltage generating capacitor 25 and the second discharge coil 13 is $Z=2\pi fL_1+2\pi fL_2-1/(2\pi fC)=46\Omega$, with the result that the voltage generated at the one end 14 of the first discharge coil 3 becomes quite small, being $V=ZI=Z\cdot(P/R)^{1/2}=1.0$ kV.

Thereafter, the high-frequency power is increased to, e.g., P=30 kW that is enough to cause a mode jump from the capacitive coupling mode to the inductive coupling mode. The voltage generated at the one end 14 of the first discharge coil 3 in this case is $V=ZI=Z\cdot(P/R)^{1/2}=2.5$ kV, which allows the plasma processing to be executed at a low voltage enough to eliminate the fear of occurrence of dielectric breakdown of the first ceramics block 4 and the second ceramics block 5 formed from dielectric.

As shown above, the plasma processing apparatus executes an operation sequence including: a first step for, while keeping the frequency of the high-frequency power supplied to the first discharge coil 3 at a relatively low frequency, adjusting the impedance value of the high-voltage generating capacitor 25 to a first impedance value and moreover setting the power value of the high-frequency power to a first power value; a second step for supplying the high-frequency power to the first discharge coil 3 to ignite the plasma F; a third step for, after the ignition of the plasma F, setting the impedance value of the high-voltage generating capacitor 25 to a second impedance value larger than the first impedance value; and a fourth step for setting the power value of the high-frequency power to a second power value larger than the first power value. In this case also, it becomes possible to satisfy both the ignitability of the plasma F and the suppression of dielectric breakdown of the dielectric members (i.e., the first ceramics block 4 and the second ceramics block 5).

Embodiment 3

Embodiment 3 of the disclosure will be described below with reference to FIG. 6. It is noted that the plasma torch unit T and the matching circuit 18 are identical in construction to those of the above-described Embodiment 1.

Figure 6:
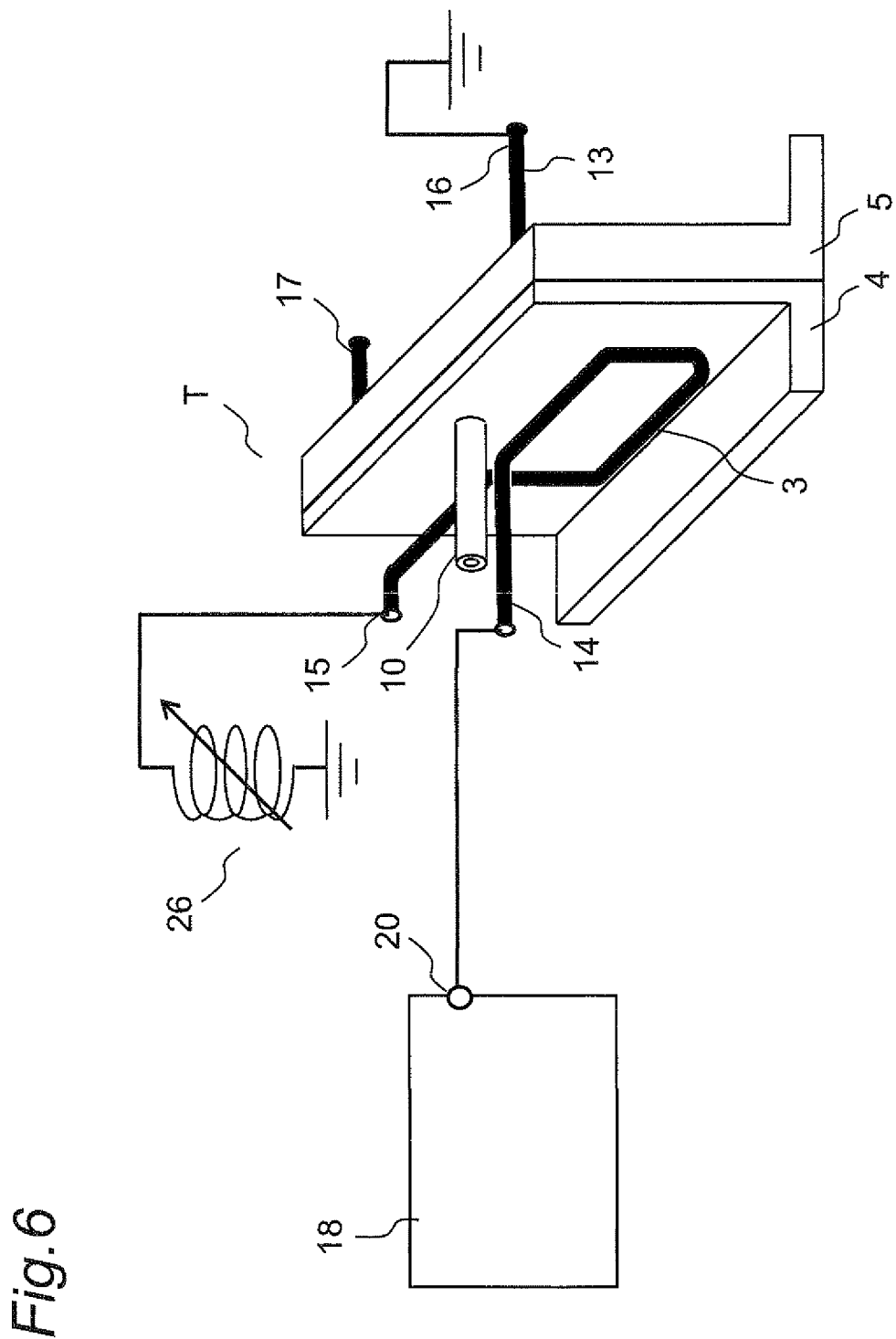
FIG. 6 is a schematic perspective view showing electrical connections of a plasma processing apparatus according to Embodiment 3 of the disclosure.

FIG. 6 is a perspective view showing electrical connections for the plasma torch unit T according to Embodiment 3 of the disclosure. As shown in FIG. 6, one end 14 of the first discharge coil 3 is connected to an output terminal 20 of the matching circuit 18. The other end 15 of the first discharge coil 3 is grounded via a high-voltage generating coil 26. The high-voltage generating coil 26 is a variable inductor. One end 16 of the second discharge coil 13 is grounded, while the other end 17 of the second discharge coil 13 is electrically floating. Instead, the other end 17 of the second discharge coil 13 may be grounded. Also, the second discharge coil 13 may be non-grounded. Further, instead of the second discharge coil 13, a conductor member of some other shape such as a ring-shaped conductor member, a rectangular plate-shaped conductor member, or the like may be substituted therefor.

In this Embodiment 3, the high-voltage generating coil 26 is used as shown in FIG. 6, unlike the high-voltage generating capacitor 24 used in Embodiment 1.

As in Embodiment 1, it is assumed that in this Embodiment 3, an inductance of the first discharge coil 3 is $L_1=1.7$ μH and a real part of the impedance as the load side (first discharge coil 3 side) is viewed from the output terminal 20 of the matching circuit 18 is $R=10\Omega$.

First, in an ignition sequence for ignition of the plasma F, the inductance of the high-voltage generating coil 26 is adjusted to a large one, e.g., L=6 μH. In this case, given a frequency of 4 MHz of the high-frequency power supplied to the first discharge coil 3, a combined impedance of the first discharge coil 3 and the high-voltage generating coil 26 is $Z=2\pi fL_1+2\pi fL=190\Omega$. In this connection, given a high-frequency power of P=5 kW, a voltage generated at the one end 14 of the first discharge coil 3 becomes $V=ZI=Z\cdot(P/R)^{1/2}=4.2$ kV, showing that even an electric power as small as 5 kW makes it possible to obtain enough high voltage for ignition.

Once a plasma F is ignited, the plasma F is not lost even if the voltage of the first discharge coil 3 has lowered to some extent. Therefore, after the ignition of the plasma F, the inductance of the high-voltage generating coil 26 is adjusted to, e.g., L=1 μH so as to be smaller than 6 μH. In this case, a combined impedance of the first discharge coil 3 and the high-voltage generating coil 26 is $Z=2\pi fL_1+2\pi fL=68\Omega$, with the result that the voltage generated at the one end 14 of the first discharge coil 3 becomes quite small, being $V=ZI=Z\cdot(P/R)^{1/2}=1.5$ kV.

Thereafter, the high-frequency power is increased to, e.g., P=30 kW that is enough to cause a mode jump from the capacitive coupling mode to the inductive coupling mode. The voltage generated at the one end 14 of the first discharge coil 3 in this case is $V=ZI=Z\cdot(P/R)^{1/2}=3.7$ kV, which allows the plasma processing to be executed at a low voltage enough to eliminate the fear of occurrence of dielectric breakdown of the first ceramics block 4 and the second ceramics block 5 formed from dielectric.

The plasma processing apparatus according to this Embodiment 3 is so constituted that a high-frequency power of relatively low frequency (e.g., 4 MHz) is supplied to the first discharge coil 3 and moreover the following operation sequence is executed. The operation sequence of the plasma processing apparatus includes: (1) a first step for, with a purpose of adjusting the impedance value of the high-voltage generating coil 26 to a first impedance value (e.g., 150Ω), adjusting the inductance value of the high-voltage generating coil 26 to a first inductance value (6 μH corresponding to 150Ω), and moreover setting the power value of the high-frequency power to a first power value (e.g., 5 kW); (2) a second step for supplying the high-frequency power to the first discharge coil 3 to ignite the plasma F; (3) a third step for, with a purpose of setting the impedance value of the high-voltage generating coil 26 to a second impedance value (e.g., 25Ω) smaller than the first impedance value, adjusting the inductance value of the high-voltage generating coil 26 to a second inductance value (1 μH corresponding to 25Ω)

after the ignition of the plasma F; and (4) a fourth step for setting the power value of the high-frequency power to a second power value (e.g., 30 kW) larger than the first power value.

Execution of the above-shown operation sequence by the plasma processing apparatus makes it possible to satisfy both the ignitability of the plasma F and the suppression of dielectric breakdown of the dielectric members.

In the above-described case, the second variable capacitor 22 of the matching circuit 18 is provided as a variable capacitor, the high-voltage generating coil 26 is provided as a variable coil, and the matching-use fixed coil 23 is provided as a fixed coil. However, this is not limitative. Instead of the second variable capacitor 22, for example, a fixed capacitor may be used. Also, a variable inductor may be used instead of the matching-use fixed coil 23. Otherwise, without use of the second variable capacitor 22, a matching state may be obtained by using a variable inductor provided instead of the matching-use fixed coil 23 as well as using the high-voltage generating coil 26.

Also, in a case where the high-frequency power supplied to the first discharge coil 3 is relatively small, the high-voltage generating coil 26 may be a fixed coil. That is, the inductance value of the high-voltage generating coil 26, which is a fixed coil, and the power value of the high-frequency power supplied to the first discharge coil are properly set to such values that the plasma F can be ignited and moreover dielectric breakdown of the first ceramics block 4 and the second ceramics block 5 formed from dielectric can be suppressed.

Further, instead of directly grounding the one end 16 of the second discharge coil 13, it is also allowable to ground the second discharge coil 13 via a coil or capacitor of very small impedance.

Also, the high-frequency power, although supplied to the first discharge coil 3 affixed to the first ceramics block 4 having no groove formed therein as shown in FIG. 2, yet may be supplied to the second discharge coil 13 affixed to the second ceramics block 5 having a groove formed therein instead of the above case.

Embodiment 4

Embodiment 4 of the disclosure will be described below with reference to FIG. 7. It is noted that the plasma torch unit T and the matching circuit 18 are identical in construction to those of the above-described Embodiment 1.

Figure 7:
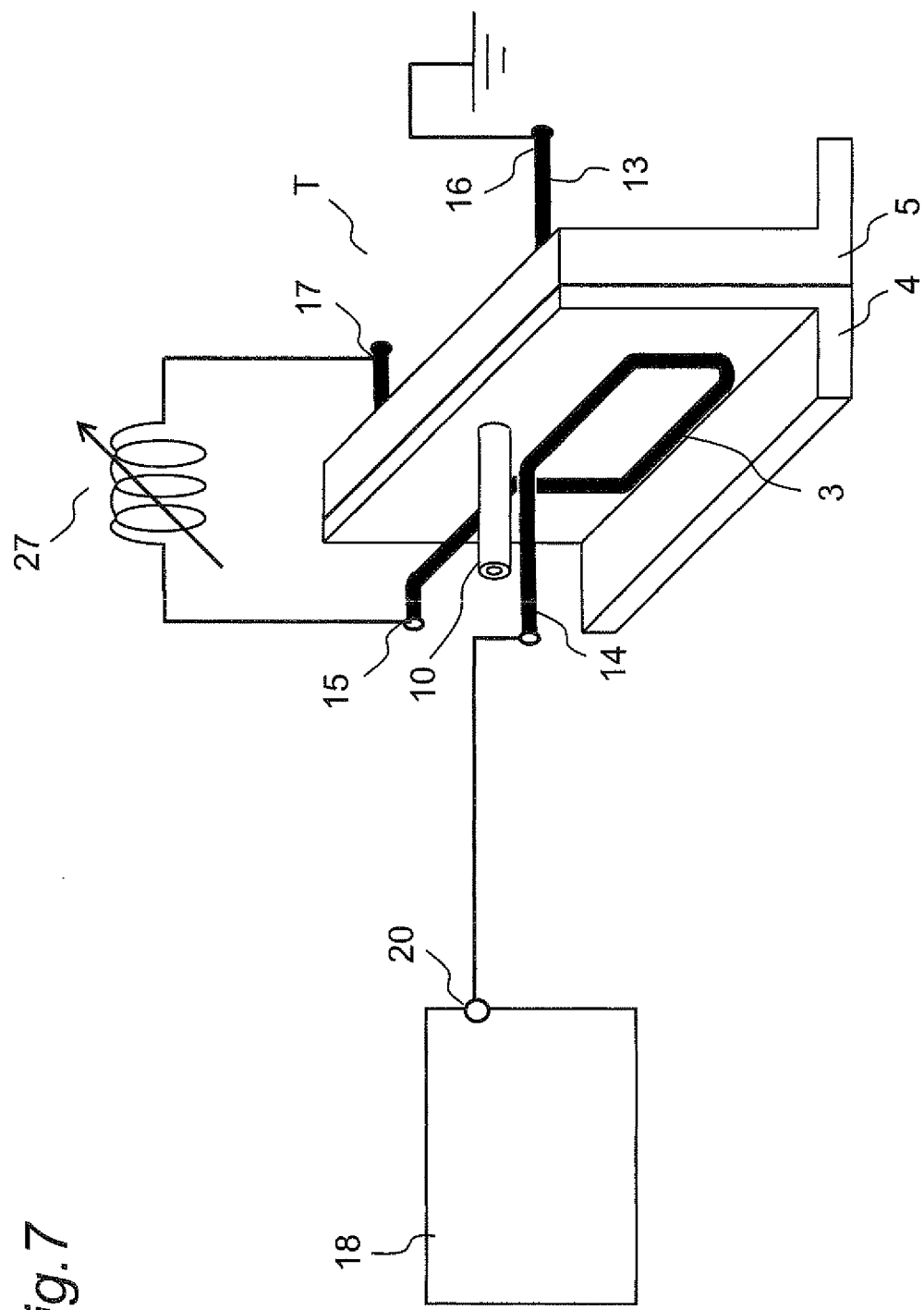
FIG. 7 is a schematic perspective view showing electrical connections of a plasma processing apparatus according to Embodiment 4 of the disclosure.

FIG. 7 is a perspective view showing electrical connections for the plasma torch unit T according to Embodiment 4. As shown in FIG. 7, one end 14 of the first discharge coil 3 is connected to the output terminal 20 of the matching circuit 18. The other end 15 of the first discharge coil 3 is connected to the other end 17 of the second discharge coil 13 via a high-voltage generating coil 27. The high-voltage generating coil 27 is a variable inductor. The one end 16 of the second discharge coil 13 is grounded.

The one end 16 of the second discharge coil 13 may be non-grounded. Also, a conductor member facing the first discharge coil 3 may be not the second discharge coil 13 but a conductor member of some other shape such as a ring-shaped conductor member, a rectangular plate-shaped conductor member, or the like.

Also in this Embodiment 4, since the impedance of the second discharge coil is small enough, the voltage of the second discharge coil 13 becomes relative lower. When the inductance of the high-voltage generating coil 27 is set large enough, the voltage of the first discharge coil 3 becomes relatively higher, causing a large potential difference to occur between the first discharge coil and the second discharge coil. As a result, even if the high-frequency power supplied to the first discharge coil 3 is low, the plasma F can be easily ignited.

Once a plasma F is ignited, the plasma F is not lost even if the voltage of the first discharge coil 3 has lowered to some extent. Therefore, after the ignition of the plasma F, the high-voltage generating coil 27 is adjusted so that its inductance is decreased. Thereafter, the high-frequency power is increased so as to become large enough to cause a mode jump from the capacitive coupling mode to the inductive coupling mode.

As shown above, the plasma processing apparatus executes an operation sequence including: a first step for, while keeping the frequency of the high-frequency power supplied to the first discharge coil 3 at a relatively low frequency, adjusting the impedance value of the high-voltage generating coil 27 to a first impedance value and moreover setting the power value of the high-frequency power to a first power value; a second step for supplying the high-frequency power to the first discharge coil 3 to ignite the plasma F; a third step for, after the ignition of the plasma F, setting the impedance value of the high-voltage generating coil 27 to a second impedance value smaller than the first impedance value; and a fourth step for setting the power value of the high-frequency power to a second power value larger than the first power value.

As a result of this, it becomes possible to satisfy both the ignitability of the plasma F and the suppression of dielectric breakdown of the dielectric members (i.e., the first ceramics block 4 and the second ceramics block 5).

In this Embodiment 4, the first discharge coil 3 and the second discharge coil 13 are placed so as to face each other with the first ceramics block 4 and the second ceramics block 5 interposed therebetween, and moreover the first discharge coil 3 and the second discharge coil 13 are connected in series at positions apart from the chamber 7 via the high-voltage generating coil 27. Therefore, the first discharge coil 3 and the second discharge coil 13 are so made up that directions of high-frequency electromagnetic fields generated in the chamber 7 by the first discharge coil 3 and the second discharge coil 13 respectively become equal to each other with the high-frequency power supplied thereto. Thus, as compared with Embodiment 3, given that the same high-frequency power is supplied, the electromagnetic fields generated in the chamber 7 become higher in intensity so that the plasma F is more easily ignitable.

Embodiment 5

Embodiment 5 of the disclosure will be described below with reference to FIGS. 8 and 9.

Figure 8:
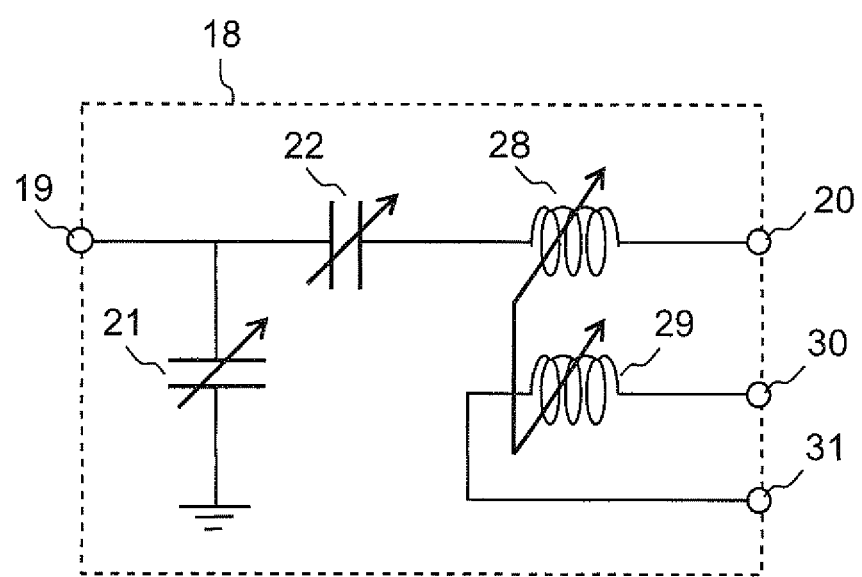
FIG. 8 is a circuit diagram showing a construction of a matching circuit of a plasma processing apparatus according to Embodiment 5 of the disclosure.

FIG. 8 is a circuit diagram showing a construction of a matching circuit 18 which is provided between the first discharge coil 3 and the high-frequency power source (not shown) and which serves for impedance matching according to this Embodiment 5. As shown in FIG. 8, an input terminal 19 of the matching circuit 18 and the high-frequency power source are connected to each other via a coaxial cable (not shown). An output terminal 20 of the matching circuit 18 is connected to the first discharge coil 3 as will be described later. Also, the input terminal 19 of the matching circuit 18 is grounded via a first variable capacitor 21. Further, the input terminal 19 is connected to the output terminal 20 via the second variable capacitor 22 and a trimming coil 28 which are connected in series. Also, a high-voltage generating coil 29 is provided, and its one end is connected to a first connecting terminal 30 while the other end is connected to a second connecting terminal 31.

Figure 9:
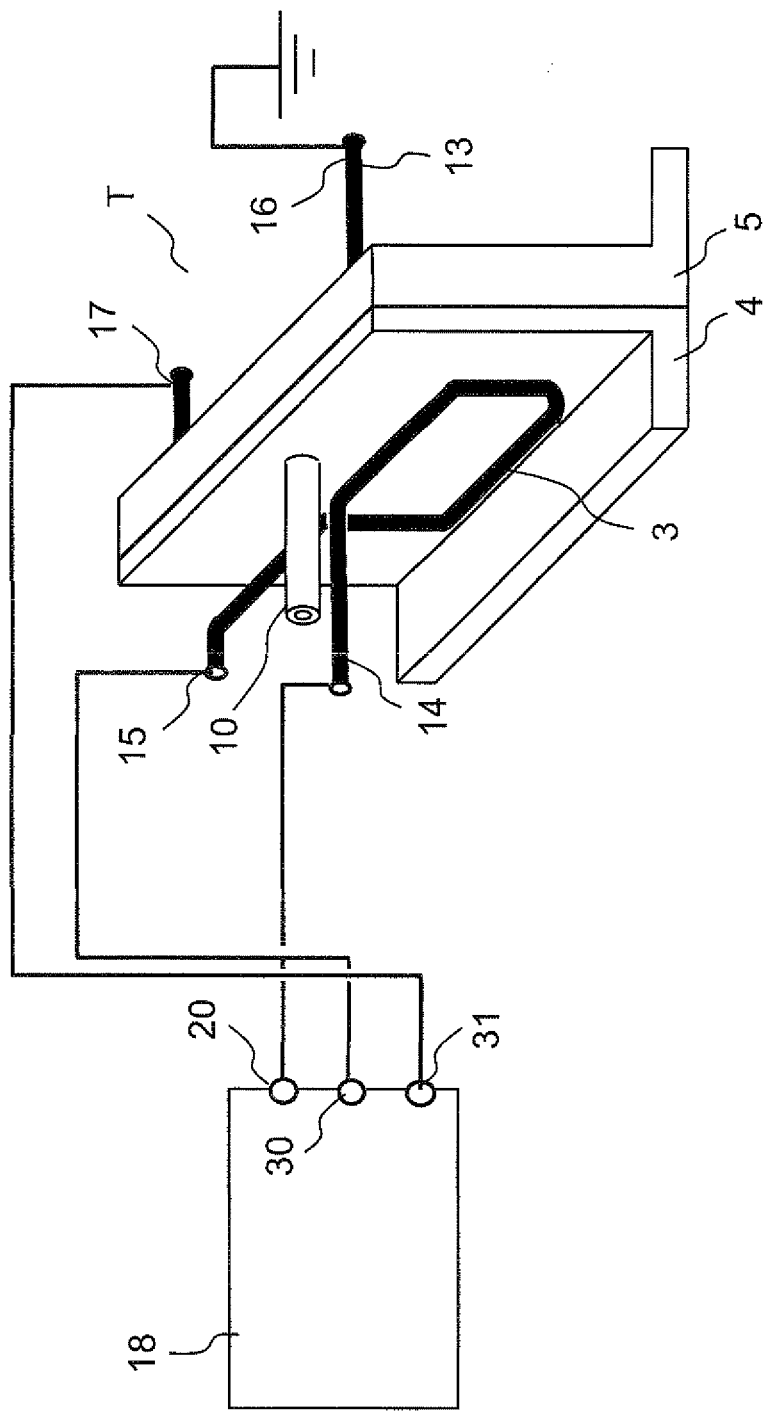
FIG. 9 is a schematic perspective view showing electrical connections of the plasma processing apparatus according to Embodiment 5 of the disclosure.

FIG. 9 is a perspective view showing electrical connections for the plasma torch unit T. As shown in FIG. 9, one end 14 of the first discharge coil 3 is connected to the output terminal 20 of the matching circuit 18. The other end 15 of the first discharge coil 3 is connected to one end of the high-voltage generating coil 29 via the first connecting terminal 30. Also, one end 17 of the second discharge coil 13 is connected to the other end of the high-voltage generating coil 29 via the second connecting terminal 31. That is, the trimming coil 28, the first discharge coil 3, and the high-voltage generating coil 29 are connected in series in this order. The other end of the second discharge coil 13 is grounded. The trimming coil 28 and the high-voltage generating coil 29 are variable inductors.

An overall construction of circuitry of Embodiment 5 is similar to that of the foregoing Embodiment 4. However, in this Embodiment 5, as shown in FIG. 8, it is possible to adjust the inductance of the high-voltage generating coil 29 while a series combined inductance of the high-voltage generating coil 29 and the trimming coil 28 is kept at a generally constant value. Accordingly, it becomes possible not only to satisfy both the ignitability of the plasma F and the suppression of dielectric breakdown of the first ceramics block 4 and the second ceramics block 5, but also to obtain a stable matching state because the matching position of the second variable capacitor 22 is hardly changed even if the inductance of the high-voltage generating coil 29 is decreased after the ignition of the plasma F.

In addition, a trimming capacitor and a high-voltage generating capacitor may be provided instead of the trimming coil 28 and the high-voltage generating coil 29. In this case, it is possible to adjust the capacitance of the high-voltage generating capacitor while the series combined capacitance of the high-voltage generating capacitor and the trimming capacitor is kept at a generally constant value. Accordingly, in this case also, it is possible to satisfy both the ignitability of the plasma F and the suppression of dielectric breakdown of the first ceramics block 4 and the second ceramics block 5. Also, it is possible to obtain a stable matching state because the matching position of the second variable capacitor 22 is hardly changed even if the capacitance of the high-voltage generating capacitor is increased after the ignition of the plasma F.

Although the plasma processing apparatus and the plasma processing method according to the present disclosure have been described hereinabove by referring to a plurality of embodiments thereof, yet these embodiments are only illustrations of typical examples of the disclosure.

For example, the plasma processing apparatuses in the plurality of embodiments described above are so designed that the substrate 1 (substrate holder 12) is moved relative to the fixed plasma torch unit T. Instead of this, the plasma torch unit T may be moved relative to the fixed substrate 1 (substrate holder 12). That is, for the embodiments of the disclosure, it is only required that the substrate 1 is moved relative to the opening 8 of the plasma torch unit T.

For example, the plasma processing apparatus (plasma torch unit) according to an embodiment of the disclosure is not limited to the plasma processing apparatuses (plasma torch units T) of the above-described embodiments. For example, a plasma processing apparatus according to another embodiment includes: a coil which is so placed that an extending direction of its center axis is perpendicular to a processing-object surface of a substrate; a dielectric member placed in the coil to define a chamber within the coil; and an electrically conductive member which is placed in the chamber and covered with a dielectric member and moreover grounded, wherein one end of the coil is connected to an AC power source for supplying AC voltage while the other end of the coil is grounded via a variable capacitor or variable coil. Even such a plasma processing apparatus is enabled to fulfill a stable plasma ignition and to suppress dielectric breakdown of the dielectric member that defines the chamber, as in the case of above-described Embodiment 1.

Also according to an embodiment of the disclosure, proximities of the surface of the substrate 1 can be high-temperature treated.

For example, embodiments of the disclosure are applicable to crystallization of TFT-use semiconductor films or reforming of solar cell-use semiconductor films. Embodiments of the disclosure are also applicable to various surface treatments such as protective-layer cleaning or degassing-reduction of plasma display panels, surface flattening or degassing-reduction of dielectric layers formed from aggregates of silica fine particles, RTP (Rapid Thermal Processing) of semiconductor devices, reflow of various electron devices, plasma doping using solid impurity sources, and the like. Embodiments of the disclosure are further applicable to a solar-cell manufacturing process which includes steps of coating a substrate with a powder obtained from pulverization of silicon ingots and then applying a plasma to the coated substrate for fusion of the powder to obtain a polysilicon film.

Although the term 'plasma' is used in the description of the above plurality of embodiments, yet there are various designations for plasma such as 'thermal plasma,' 'thermal-equilibrium plasma,' 'low-temperature plasma' and 'high-temperature plasma'. However, it is hard to strictly discriminate plasmas of these designations. For example, as explained in TANAKA Yasunori, "Non-Equilibria in Thermal Plasmas," Journal of Plasma and Fusion Research, Vol. 82, No. 8(2006) pp. 479-483, it is also hard to discriminate kinds of plasmas only by thermal equilibrium.

In a broad sense, embodiments of the disclosure require the plasma only to be capable of heat-treating the substrate, and relate to irradiation with the plasma. Accordingly, embodiments of the disclosure are not limited to plasmas designated as 'thermal plasma,' 'thermal-equilibrium plasma,' 'high-temperature plasma,' or the like.

The above embodiments have been described on cases where proximities of the substrate surface are heat-treated at high temperatures uniformly for an extremely short time period. However, the disclosure is also applicable to cases where the substrate is processed with low-temperature plasma by irradiation of the substrate with a plasma obtained by a reactant gas or by simultaneous irradiation of both a plasma and a reactant gas flow. By mixing a plasma gas with a reactant gas, it becomes possible to irradiate the substrate with a plasma obtained by a reactant gas to fulfill etching or CVD.

Furthermore, in a case where a rare gas or a gas obtained by adding a small quantity of $H_2$ gas to a rare gas is used as a plasma gas and where a gas containing the reactant gas is supplied to peripheries of the plasma gas as a shielding gas, the substrate can be irradiated with the plasma and the reactant gas flow simultaneously so that plasma processing such as etching, CVD and doping can be fulfilled. Using a gas composed mainly of argon as a plasma gas causes generation of a 'thermal plasma' in which ions, electrons, neutral atoms and the like in the plasma are generally equal in temperature, their temperatures reaching about 10000K.

In another case where a gas composed mainly of helium is used as a plasma gas, it becomes possible to generate a plasma of relatively low temperature. Using such a plasma gas allows etching, film deposition or other processes to be achieved without heating the substrate so much.

Among reactant gases to be used for etching are halogen-containing gases such as $C_xF_y$ (where x and y are natural numbers) and $SF_6$, by which silicon, silicon compounds and the like can be etched. Using $O_2$ as a reactant gas makes it possible to achieve removal of organic matters, resist ashing, formation of extremely thin oxide films, and the like. Reactant gases for use in CVD include monosilane, disilane and the like, by which film deposition of silicon or silicon compounds can be achieved. Otherwise, with use of a mixed gas of silicon-containing organic gas and $O_2$ typified by TEOS (tetraethoxysilane), film deposition of silicon oxide films can be achieved.

In addition, various types of low-temperature plasma processing such as surface treatment for reforming in water repellency or hydrophilicity can be implemented. According to the inductively coupled plasma processing apparatus as in the embodiments of the present disclosure, since a move to arc discharge is less likely to occur even with input of high power density per unit volume, higher-density plasmas can be generated, so that faster reaction speed can be obtained, making it possible to process the whole processing-object region of the substrate with higher efficiency and shorter time.

As shown above, the present disclosure is applicable to crystallization of TFT-use semiconductor films or reforming of solar cell-use semiconductor films. More specifically, the disclosure is applicable to various surface treatments such as protective-layer cleaning or degassing-reduction of plasma display panels, surface flattening or degassing-reduction of dielectric layers formed from aggregates of silica fine particles, RTP of semiconductor devices, reflow of various electron devices, plasma doping using solid impurity sources, and the like. That is, in processing in which surface proximities of the substrate are heat-treated at high temperatures uniformly in an short time period, the disclosure is useful in terms of stably and efficiently generating a plasma and processing the whole processing-object region of the substrate with higher efficiency and shorter time. Furthermore, in low-temperature plasma processing such as etching, film deposition, doping and surface reforming in manufacture of various types of electron devices and the like, the disclosure is useful for processing of the whole processing-object region of the substrate with higher efficiency and shorter time.

The invention claimed is:

1. A plasma processing apparatus comprising:
an inductively coupled plasma torch unit having
a dielectric member for defining a chamber,
a gas introducing part for introducing a gas into the chamber,
a discharge coil disposed on one side of the dielectric member and supplied with AC power to generate a plasma in the chamber into which the gas has been introduced, and
a conductor member disposed on the other side of the dielectric member and facing the discharge coil with the chamber of the dielectric member interposed therebetween;
an AC power source for supplying AC voltage to the discharge coil;
an opening communicating with the chamber and serving for applying the plasma to a substrate to be processed, the opening being a slot-like long opening; and
a moving mechanism for moving the substrate relative to the inductively couple plasma torch unit so that the substrate passes across a front of the opening,
wherein the discharge coil is grounded or connected to the conductor member via a voltage generating capacitor or a voltage generating coil,
wherein the dielectric member includes a first ceramics block and a second ceramics block, the first ceramics block and the second ceramics block being in contact with each other so that the chamber and the opening are defined therebetween, and
wherein the chamber is formed into an annular shape having a first linear portion communicating with the opening and extending in a longitudinal direction of the opening, a second linear portion extending with a distance to and in parallel to the first linear portion, and third and fourth linear portions for connecting both ends of the first and second linear portions, respectively.

2. The plasma processing apparatus according to claim 1, further comprising a trimming capacitor or a trimming coil different from the voltage generating capacitor or the voltage generating coil, wherein
the trimming capacitor or the trimming coil, the discharge coil, and the voltage generating capacitor or the voltage generating coil are connected in series in this order.

3. The plasma processing apparatus according to claim 2, wherein while a series combined capacitance of the voltage generating capacitor and the trimming capacitor or a series combined inductance of the voltage generating coil and the trimming coil is maintained at a constant value, a capacitance of the voltage generating capacitor or an inductance of the voltage generating coil can be adjusted.

4. The plasma processing apparatus according to claim 1, wherein a frequency of the AC power supplied to the first discharge coil is within a range from 10 kHz to 10 MHz.

5. The plasma processing apparatus according to claim 1, wherein the opening is disposed relative to the substrate so that a plane containing a rim of the opening parallels a surface of the substrate to be processed.

* * * * *